United States Patent
Bae

(10) Patent No.: US 8,253,201 B2
(45) Date of Patent: Aug. 28, 2012

(54) MEMORY DEVICE

(75) Inventor: Dong-Il Bae, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 131 days.

(21) Appl. No.: 12/458,800

(22) Filed: Jul. 23, 2009

(65) Prior Publication Data

US 2010/0019299 A1      Jan. 28, 2010

(30) Foreign Application Priority Data

Jul. 24, 2008   (KR) .................. 10-2008-0071995

(51) Int. Cl.
*H01L 27/12* (2006.01)

(52) U.S. Cl. ........ 257/347; 257/295; 257/296; 257/300; 257/350; 257/E27.084

(58) Field of Classification Search .............. 257/347, 257/350, 295.296, 300, E27.084, E27.085
See application file for complete search history.

(56) References Cited

U.S. PATENT DOCUMENTS

| | | | | |
|---|---|---|---|---|
| 5,986,301 A * | 11/1999 | Fukushima et al. | ...... | 257/306 |
| 6,441,436 B1 * | 8/2002 | Wu et al. | ...... | 257/350 |
| 6,876,021 B2 * | 4/2005 | Martin et al. | ...... | 257/295 |
| 6,992,928 B2 | 1/2006 | Inoue | | |
| 7,061,032 B2 * | 6/2006 | Kajiyama | ...... | 257/288 |
| 7,158,410 B2 | 1/2007 | Bhattacharyya et al. | | |
| 2003/0057488 A1 * | 3/2003 | Hirose et al. | ...... | 257/347 |
| 2005/0018526 A1 * | 1/2005 | Lee | ...... | 365/232 |
| 2005/0199924 A1 * | 9/2005 | Fox et al. | ...... | 257/295 |
| 2008/0048239 A1 | 2/2008 | Huo et al. | | |

FOREIGN PATENT DOCUMENTS

| | | |
|---|---|---|
| JP | 2007-129040 A | 5/2007 |
| KR | 10-2003-0081131 A | 10/2003 |
| KR | 10-2007-0042585 A | 4/2007 |
| KR | 10-2008-0018040 A | 2/2008 |

* cited by examiner

Primary Examiner — Kenneth Parker
Assistant Examiner — Jose R Diaz
(74) Attorney, Agent, or Firm — Lee & Morse, P.C.

(57) ABSTRACT

A memory device includes a MOS transistor including a gate structure, a first impurity region, a second impurity region, and a floating body positioned between the first and the second impurity regions on a semiconductor substrate including a buried oxide layer. The memory device includes a charge storage structure of the non-volatile memory device electrically connected to the second impurity region of the MOS transistor.

13 Claims, 6 Drawing Sheets

MEMORY DEVICE

BACKGROUND

1. Field

Example embodiments relate to a memory device, a method of manufacturing the same, and a method of operating the same. More particularly, example embodiments relate to a memory device operating as a volatile memory device or a non-volatile memory device in accordance with an operation mode, a method of manufacturing the same, and a method of operating the same.

2. Description of the Related Art

Generally, semiconductor memory devices may be classified into non-volatile semiconductor devices, e.g., flash memory devices, and volatile semiconductor devices, e.g., dynamic random access memory (DRAM) devices, static random access memory (SRAM) devices, etc.

Stored data may be maintained in the non-volatile semiconductor memory device even though power is turned off. Non-volatile memory devices, however, may require a relatively long time for data reading and writing and, thus, are usually not used in electronic devices requiring frequent access, e.g., a number of times of reading/writing data in the non-volatile memory devices may be limited.

In contrast, stored data may not be maintained in the volatile semiconductor memory devices when power is turned off. Volatile memory devices, however, may require a relatively short time for data reading and writing, and thus, the number of times of reading/writing data in the volatile memory devices may rarely be limited.

SUMMARY

Embodiments are therefore directed to a memory device, a method of manufacturing the same, and a method of operating the same, which substantially overcome one or more of the problems due to the limitations and disadvantages of the related art.

It is therefore a feature of an embodiment to provide a memory device capable of operating as a volatile memory device or a non-volatile memory device in accordance with a selected operation mode.

It is therefore another feature of an embodiment to provide a method of manufacturing a memory device capable of operating as a volatile memory device or a non-volatile memory device in accordance with a selected operation mode.

It is yet another feature of an embodiment to provide a method of operating a memory device as a volatile memory device or a non-volatile memory device in accordance with a selected operation mode.

At least one of the above and other features and advantages may be realized by providing a memory device, including a metal-oxide semiconductor (MOS) transistor on a semiconductor substrate having a buried oxide layer and a charge storage structure of a non-volatile memory device. The MOS transistor may include a gate structure, a first impurity region, a second impurity region and a floating body between the first impurity region and the second impurity region. The charge storage structure of the non-volatile memory device may be electrically connected to the second impurity region of the MOS transistor.

In an example embodiment, charge storage structure may include a capacitor having a lower electrode, a ferroelectric layer pattern and an upper electrode.

In an example embodiment, a contact plug may be interposed between the lower electrode of the capacitor and the second impurity region.

In an example embodiment, a plate line electrically connected to the upper electrode of the capacitor may be provided.

In an example embodiment, the charge storage structure may include a capacitor having a lower electrode, a phase-changeable pattern and an upper electrode.

In an example embodiment, the lower electrode may have a contact plug shape.

In an example embodiment, a bit line electrically connected to the first impurity region may be provided.

In an example embodiment, bottom surfaces of the first impurity region and the second impurity region may contact the buried oxide layer, the floating body being defined by the first impurity region, the second impurity region, and the buried oxide layer.

At least one of the above and other features and advantages may also be realized by providing a method of manufacturing a memory device, including forming a gate structure on a semiconductor substrate having a buried oxide layer. First and second impurity regions and a floating body interposed between the first and second impurity regions may be formed under the gate structure by doping impurities onto the substrate adjacent to the gate structure. A charge storage structure of a non-volatile memory device may be formed, which is electrically connected to the second impurity region.

In an example embodiment, a contact plug electrically connected to the second impurity region may be formed. A lower electrode electrically connected to the contact plug may be formed. A ferroelectric layer pattern and an upper electrode may be formed on the lower electrode.

In an example embodiment, a lower electrode electrically connected to the second impurity region may be formed on the lower electrode. A phase-changeable pattern and an upper electrode may be formed on the lower electrode.

At least one of the above and other features and advantages may also be realized by providing a method of operating a memory device having a MOS transistor with a gate structure, a first impurity region, a second impurity region and a floating body positioned between the first and the second impurity regions on a semiconductor substrate having a buried oxide layer, and a charge storage structure of a non-volatile memory device electrically connected to the second impurity region of the MOS transistor. In the method, one of a volatile mode and a non-volatile mode may be selected as an operation mode of the memory device. Data may be written in the floating body when the memory device is operated in the non-volatile mode. Data may be written in the floating body when the memory device is operated in the volatile mode.

In an example embodiment, writing data in the floating body may be performed by one of storing electric holes in the floating body and moving the electric holes out from the floating body.

In an example embodiment, writing data in the floating body may include grounding the charge storage structure, such that the second impurity region may be grounded through the charge storage structure.

In an example embodiment, writing data in the floating body may include applying a negative bias voltage to a rear surface of the semiconductor substrate as a back gate voltage, the rear surface of the semiconductor substrate being opposite a front surface of the semiconductor substrate on which the MOS transistor may be positioned.

In an example embodiment, writing data in the charge storage structure may include one of steps of applying a positive voltage to a rear surface of the semiconductor substrate and grounding the semiconductor substrate, the rear surface of the semiconductor substrate being opposite a front surface of the substrate on which the MOS transistor may be positioned.

In an example embodiment, writing data in the charge storage structure is performed without writing data in the floating body, such that the MOS transistor may function as a switching device.

In an example embodiment, writing data in the charge storage structure may be performed by changing a polarization state of a ferroelectric layer pattern of the charge storage structure, the charge storage structure including a capacitor having a lower electrode, the ferroelectric layer pattern, and an upper electrode.

In an example embodiment, writing data in the charge storage structure may be performed by changing an electrical resistance of a phase-changeable pattern of the charge storage structure, the charge storage structure including a capacitor having a lower electrode, the phase-changeable pattern, and an upper electrode.

In an example embodiment, a bit line voltage applied to a bit line of the complementary metal-oxide semiconductor (CMOS) memory, which may be electrically connected to the first impurity region, may be pumped to be high so that a high electrical current may pass through the phase-changeable pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
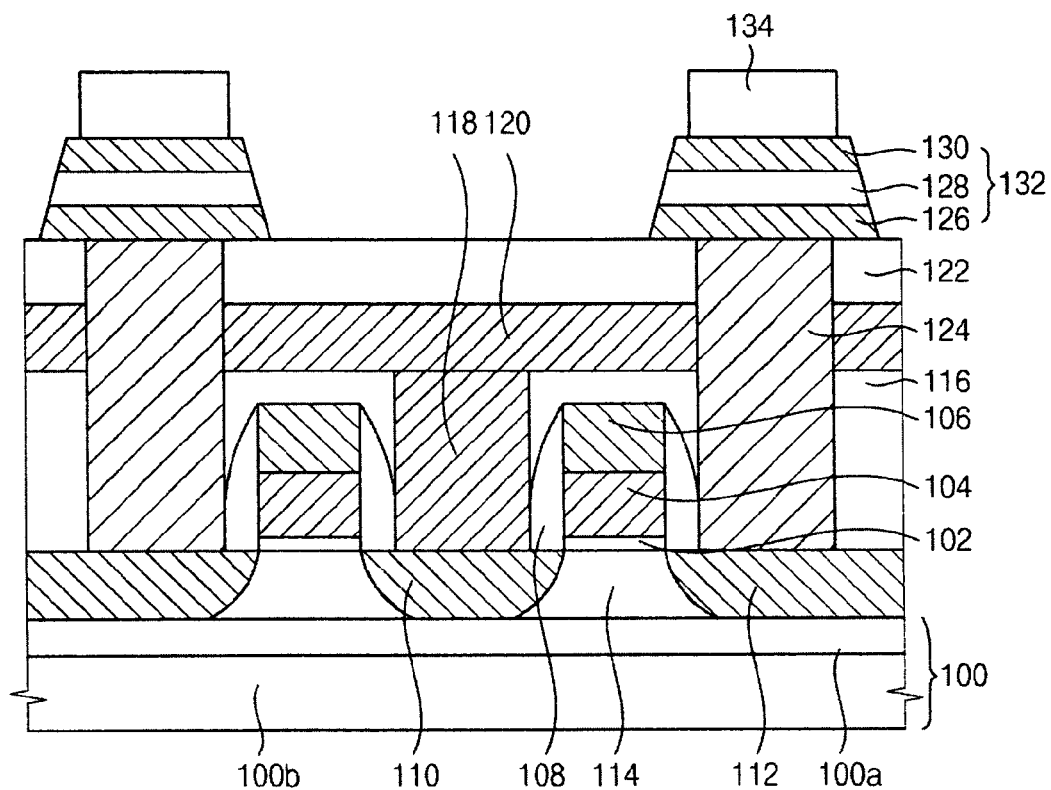
FIG. 1 illustrates a cross-sectional view of a memory device in accordance with an example embodiment.

Korean Patent Application No. 10-2008-0071995, filed on Jul. 24, 2008, in the Korean Intellectual Property Office, and entitled: "Memory Device, Method of Manufacturing the Same and Method of Operating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also understood that when an element or layer is referred to as being "on," "under," "connected to," or "coupled to" another element or layer, it may be directly on, under, connected or coupled to the other element or layer, or intervening elements or layers may be present. In addition, when a layer or element is referred to as being "between" two layers, it can be the only layer between the two layers, or one or more intervening layers may also be present. In contrast, when an element is referred to as being "directly on," "directly under," "directly connected to," "directly coupled to," or "directly between" other elements or layers, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of a memory device in accordance with a first example embodiment. As illustrated in FIG. 1, the memory device may include a MOS transistor on a semiconductor substrate 100 and a capacitor 132 electrically connected to the MOS transistor.

In particular, referring to FIG. 1, the semiconductor substrate 100 may include a buried oxide layer 100a on a mother substrate 100b. For example, the semiconductor substrate 100 may have a stacked structure in which a lower semiconductor layer (not illustrated), the buried oxide layer 100a, and an upper semiconductor layer (not illustrated) may be sequentially stacked. For example, the semiconductor substrate 100 may be a silicon-on-insulator (SOI) substrate.

An active region (not illustrated) and a non-active region (not illustrated) may be defined on the semiconductor substrate 100 by an insulation pattern on the upper semiconductor layer. That is, the upper semiconductor layer may include an opening, such that the active region, i.e., a region on which various conductive structures may be formed, and the non-active region, i.e., a region surrounding the active region, may be defined on the mother substrate 100b. The insulation pattern (not shown) may be positioned in the opening of the upper semiconductor layer, so that the conductive structures of the active region may be electrically isolated from structures in a neighboring active region by the insulation pattern. The insulation pattern in the opening may be referred to as a device isolation pattern.

As illustrated in FIG. 1, a gate insulation layer pattern 102 and a gate electrode 104 may be sequentially provided on the semiconductor substrate 100 to form a gate structure. A gate spacer 108 may be provided on sidewalls of the gate structure. A hard mask pattern 106 may be provided on the gate electrode 104. The gate electrode 104 may extend in a first direction and may have a line shape. The gate electrode 104 may serve as a word line. It is noted that, hereinafter, the terms gate electrode 104 and word line 104 may be used interchangeably.

First and second impurity regions 110 and 112 may be provided at surface portions of the semiconductor substrate 100 adjacent to the gate structure, e.g., the gate structure may be between the first and second impurity regions 110 and 112. In the present example embodiment, the first and second impurity regions 110 and 112 may be provided as source and drain regions of a transistor together with the gate structure. In other words, the MOS transistor of the memory device may include the gate structure with the first and second impurity regions 110 and 112. For example, the gate structure with the first and second impurity regions 110 and 112 may be positioned on the buried oxide layer 110, so the buried oxide layer 110 may overlap, e.g., completely overlap, the MOS transistor, i.e., the gate structure and the first and second impurity regions 110 and 112.

A bottom surface, i.e., a surface facing the mother substrate 100b, of the first and the second impurity regions 110 and 112 may contact, e.g., directly contact, the buried oxide layer 100a. Thus, a channel region may be defined by the buried oxide layer 100a, the first impurity region 110, and the second impurity region 112. The channel region between the first and the second impurity regions 110 and 112 may function as a floating body 114 because the channel region may be in an electrical floating state. As illustrated in FIG. 1, the floating body 114 may be enclosed, e.g., completely enclosed, by the first impurity region 110, second impurity region 112, buried oxide layer 100a, and the gate structure.

First impurities having a first conductivity type may be doped into the first and the second impurity regions 110 and 112. Second impurities having a second conductivity type, e.g., different from the first conductivity type, may be doped into the floating body 114.

Data may be stored in the MOS transistor by storing holes in the floating body 114 or by moving the holes out from the floating body 114. A threshold voltage of the MOS transistor may be varied according to the movement of the holes in the floating body 114, so the data in the MOS transistor may be read by detecting the variation of the threshold voltage. Therefore, the MOS transistor may function as a volatile semiconductor device, e.g., a one-transistor dynamic random access memory (1T-DRAM) device.

In an example embodiment, as illustrated in FIG. 1, a bit line structure may be electrically connected to the first impurity region 110 of the MOS transistor. For example, the bit line structure may include a bit line contact 118 electrically connected to the first impurity region 110 and extending upward, and a bit line 120 electrically connected to the bit line contact 118. The bit line 120 may extend in a second direction substantially perpendicular to the first direction, i.e., substantially perpendicular to the word line.

In an example embodiment, as further illustrated in FIG. 1, the capacitor 132 may be electrically connected to the second impurity region 112 of the MOS transistor. For example, the capacitor 132 may include a lower electrode 126, a ferroelectric layer pattern 128, and an upper electrode 130.

Particularly, a capacitor contact plug 124 may be electrically connected to the second impurity region 112 of the MOS transistor, and the lower electrode 126 of the capacitor 132 may be electrically connected to the capacitor contact plug 124. For example, the capacitor contact plug 124 may extend between the second impurity region 112 and the lower electrode 126, and the ferroelectric layer pattern 128 and the upper electrode 130 may be sequentially stacked on the lower electrode 126. The ferroelectric layer pattern 128 may include, e.g., one or more of lead zirconate titanate (Pb(Zr, Ti)O$_3$; PZT), strontium bismuth tantalate (Sr(Bi, Ta)O$_3$; SBT), bismuth lanthanum titanate (Bi(La, Ti)O$_3$; BLT), etc. These may be used alone or in combinations thereof. The capacitor 132 may be positioned higher than the bit line 120 with respect to the semiconductor substrate 100, e.g., the bit line 120 may be positioned between the capacitor 132 and the MOS transistor. For example, a bottom surface of the capacitor 132 may be vertically spaced apart from the bit line 120, e.g., a distance between a bottom surface of the lower electrode 126 and a reference point on the semiconductor substrate 100 may be larger than a distance between an upper surface of the bit line 120 and the reference point on the semiconductor substrate 100. It is noted, however, that even though FIG. 1 illustrates that the capacitor 132 is positioned higher than the bit line 120, other relative configurations of the capacitor 132 and bit line 120 are within the scope of the inventive concept, e.g., the capacitor 132 may be positioned lower than the bit line 120 relative to the semiconductor substrate 100.

A plate line 134 may be provided on the upper electrode 130. The plate line 134 may extend along the first direction, i.e., may be substantially parallel to a direction of the word line.

Data may be stored in the capacitor 132 by changing polarity of the ferroelectric layer pattern 128 of the capacitor 132. The voltage of the bit line 120 may be varied according to the polarity of the ferroelectric layer pattern 128 of the capacitor 132, and thus the data of the capacitor 132 may be read by detecting the variation of the bit line voltage. Therefore, the capacitor 132 may function as a non-volatile semiconductor device, e.g., a ferroelectric random access memory (FRAM) device.

Accordingly, the memory device illustrated in FIG. 1 may operate either as a volatile memory device, i.e., via the MOS transistor, or as a non-volatile memory device, i.e., via the capacitor 132, in accordance with a selected operation mode. For example, when frequent access and a high operation speed is needed in the memory device, the memory device may operate as a volatile memory device, and when the data in the memory device is needed to be maintained even though the power is turned off, the memory device may operate as a non-volatile memory device.

Figure 2:
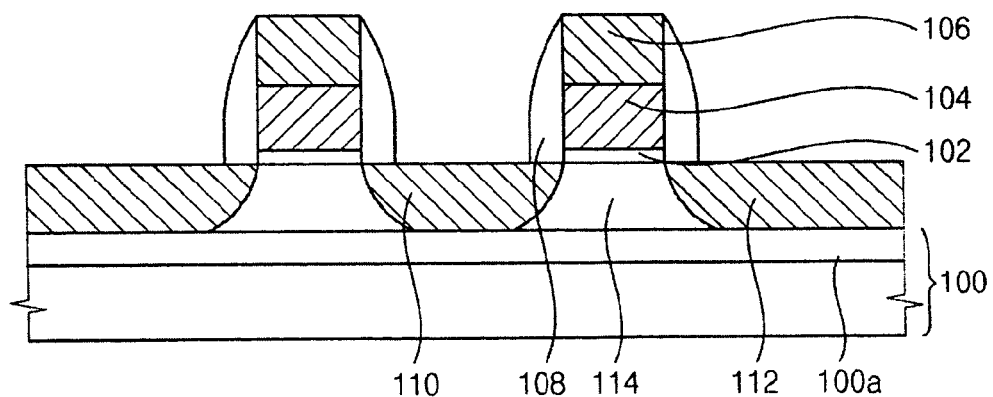
FIGS. 2 to 4 illustrate cross-sectional views of steps in a method of manufacturing the memory device illustrated in FIG. 1.
Figure 3:
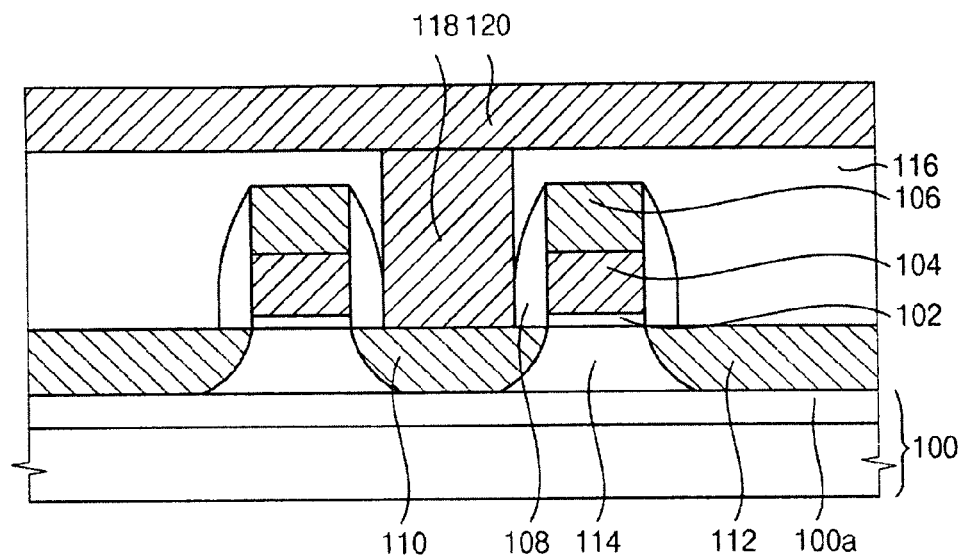
Figure 4:
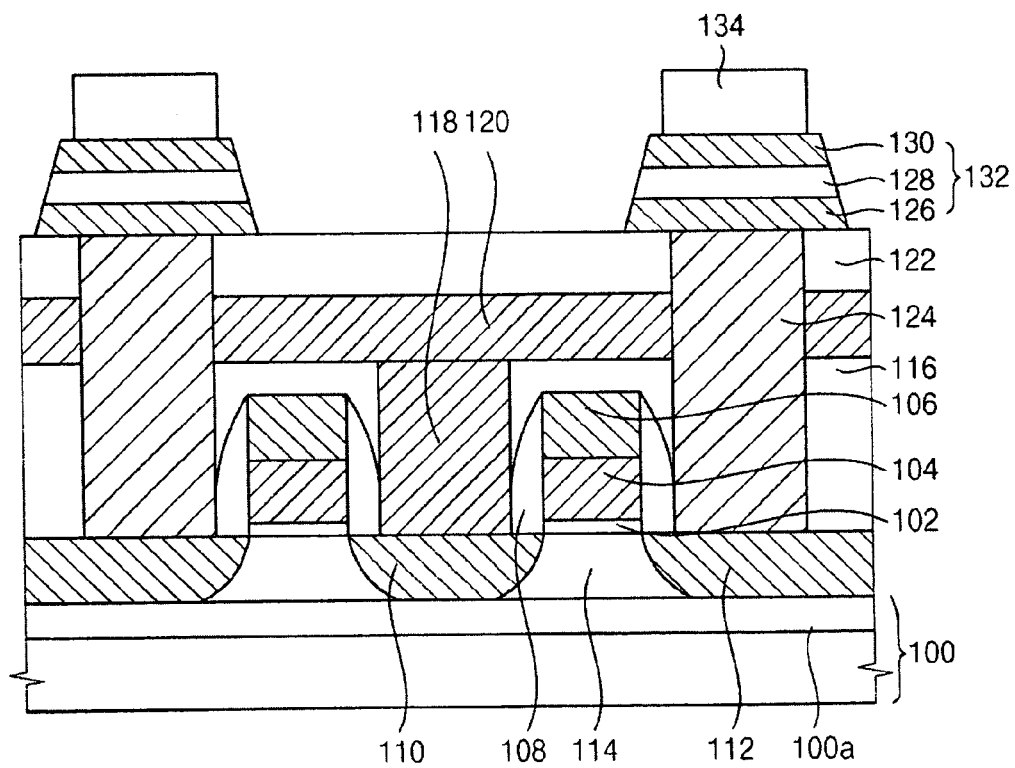

Hereinafter, a method of manufacturing a memory device according to example embodiments will be described. FIGS. 2 to 4 illustrate cross-sectional views of steps in a method of manufacturing the memory device of FIG. 1.

Referring to FIGS. 1 and 2, the semiconductor substrate 100 including the buried oxide layer 100a may be prepared. For example, the lower semiconductor layer, the buried oxide layer 100a, and the upper semiconductor layer may be sequentially stacked on the mother substrate 100b, and the upper semiconductor layer may be formed into a pattern having an opening. An insulation pattern filling up the opening may be formed on the semiconductor substrate 100, and the semiconductor substrate 100 may be defined into an active region and a non-active region, i.e., a field region around the active region. The conductive structures on neighboring active regions may be electrically insulated from each other by the insulation layer. The semiconductor substrate 100 may be, e.g., a SOI substrate. The second impurities with the second conductivity type may be doped into an upper portion of the semiconductor substrate 100 to form a channel region.

A gate insulation layer (not illustrated), a gate electrode layer (not illustrated), and the hard mask pattern 106 may be formed on, e.g., directly on, the semiconductor substrate 100. The gate electrode layer and the gate insulation layer may be etched using the hard mask pattern 106 as an etching mask to form the gate electrode 104 and the gate insulation layer pattern 102. The gate electrode 104 may extend in the first direction, and may serve as a word line.

An insulation layer (not illustrated) may be formed on the semiconductor substrate 100 to a sufficient thickness to cover the gate structure including the gate electrode 104 and the hard mask pattern 106. Then, the insulation layer may be, e.g., anisotropically, etched off from the semiconductor substrate 100 to form the gate spacer 108 on sidewalls of the gate structure.

The first impurities having a first conductivity type may be implanted onto the semiconductor substrate 100 using the gate spacer 108 as an implantation mask, thereby forming the first and second impurity regions 110 and 112 at the surface portions of the semiconductor substrate 100. It is noted, however, that example embodiments are not limited thereto, e.g., the first and second impurity regions 110 and 112 may be formed before the gate spacer 108 using the gate structure as an implantation mask, so the gate spacer 108 may be formed on a portion of the first and second impurity regions 110 and 112.

The first impurities may be implanted to a predetermined depth, so the bottom surfaces of the first and the second impurity regions 110 and 112 may extend from an upper surface of the semiconductor substrate 100 to the buried oxide layer 100a to make contact, e.g., direct contact, with the buried oxide layer 100a. A portion of the semiconductor substrate 100 between the first and second impurity regions 110 and 112, i.e., under the gate structure, may include the second impurities and may define the channel region. In other words, since the first and second impurity regions 110 and 112 contact the buried oxide layer 100a, the channel region may be defined by the first and the second impurity regions 110 and 112 and the buried oxide layer 100a. The channel region may function as the floating body 114.

As a result of the above processing steps, the MOS transistor functioning as a volatile memory device may be formed on the semiconductor substrate 100. In the present example embodiment, a pair of the MOS transistors may be formed to share a common source impurity region, as illustrated in FIG. 2.

Referring to FIGS. 1 and 3, a first insulating interlayer 116 may be formed on the semiconductor substrate 100 to a sufficient thickness to cover the MOS transistor. Then, the first insulating interlayer 116 may be partially removed from the semiconductor substrate 100 to form a first contact hole through which the first impurity region 110 may be exposed. A conductive material may be deposited to fill, e.g., completely fill, the first contact hole to form the bit line contact 118 on the first impurity region 110. The bit line 120 may be formed on the first insulating interlayer 116, such that the bit line 120 may make contact with the bit line contact 118. The bit line 120 may extend in the second direction, i.e., substantially perpendicularly to the first direction.

While the bit line contact 118 and the bit line 120 are described with reference to FIG. 3 as being formed sequentially via separate steps on the semiconductor substrate 100, any other suitable process may be employed for forming the bit line contact 118 and the bit line 120. For example, the bit line contact 118 and the bit line 120 may be simultaneously formed in a single deposition process and a single patterning process.

In addition, a capacitor contact pad (not illustrated) may also be formed on the semiconductor substrate 100 simultaneously at the time the bit line contact 118 is formed. The capacitor contact pad may be electrically connected to the capacitor 132 in subsequent processes.

Referring to FIG. 4, a second insulating interlayer 122 may be formed on the first insulating interlayer 116 and bit line 120. Then, the first insulating interlayer 116 and the second insulating interlayer 122 may be sequentially and partially removed from the semiconductor substrate 100 to form a second contact hole through which the second impurity region 112 may be exposed. It is noted that if the capacitor contact pad and the bit line contact 118 are formed simultaneously on the semiconductor substrate 100, a top surface of the capacitor contact pad may be exposed through the second contact hole.

A conductive material may be deposited to fill, e.g., completely fill, the second contact hole to form the capacitor contact plug 124 on the second impurity region 112 of the MOS transistor. The capacitor contact plug 124 may be electrically connected to the second impurity region 112 or the capacitor contact pad.

A lower electrode layer (not illustrated) may be formed on the second insulating interlayer 122 and the capacitor contact plug 124 and may include a first conductive material. Examples of the first conductive material for the lower electrode layer may include one or more of iridium (Ir), iridium oxide (IrOx), platinum (Pt), strontium ruthenium oxide (Sr-RuO$_3$; SRO), etc. These may be used alone or in combinations thereof. The lower electrode layer may have a single-layer or multilayer structure. For example, the lower electrode layer may include a multilayer having an iridium (Ir) layer, an iridium oxide (IrOx) layer, and a platinum (Pt) layer that may be sequentially stacked on the second insulating interlayer 122 and the capacitor contact plug 124.

A ferroelectric layer (not illustrated) may be formed on the lower electrode layer. The ferroelectric layer may include one or more of lead zirconate titanate (Pb(Zr, Ti)O$_3$; PZT), strontium bismuth tantalate (Sr(Bi, Ta)O$_3$; SBT), bismuth lanthanum titanate (Bi(La, Ti)O$_3$; BLT), etc.

An upper electrode layer (not illustrated) may be formed on the ferroelectric layer, e.g., the ferroelectric layer may be between the lower and upper electrode layers, and may include a second conductive material. Examples of the second conductive material for the upper electrode layer may include one or more of iridium oxide (IrOx), iridium (Ir), strontium ruthenium oxide (SrRuO$_3$; SRO), etc. These may be used alone or in combinations thereof. The upper electrode layer may have a single-layer or multilayer structure. For example, the upper electrode layer may include a multilayer in which an iridium oxide layer and an iridium layer may be sequentially stacked on the ferroelectric layer.

The upper electrode layer, the ferroelectric layer, and the lower electrode layer may be sequentially patterned into the lower electrode 126, the ferroelectric layer pattern 128, and the upper electrode 130, respectively. The lower electrode 126, the ferroelectric layer pattern 128, and the upper electrode 130 may define the capacitor 132. For example, the capacitor 132 may be on, e.g., directly on, the contact plug 124, and may overlap the second impurity region 112 of the MOS transistor. For example, a width of the lower electrode 126 along a horizontal direction may be larger than a width of the contact plug 124, e.g., the lower electrode 126 may completely overlap the contact plug 124 and a portion of the second insulating interlayer 122.

Thereafter, the plate line 134 may be formed on the upper electrode 130 of the capacitor 132. The plate line 134 may be electrically connected to the upper electrode 130 and may extend in the first direction substantially parallel with the word line. For example, the plate line 134 may include a metal, e.g., aluminum (Al).

Hereinafter, a method of operating the memory device in FIG. 1 will be described in accordance with an example embodiment.

Method of Storing Data into a Floating Body

When the memory device illustrated in FIG. 1 is operated as a volatile memory device (hereinafter referred to as volatile operation mode), digital information data may be stored into, e.g., only into, the floating body 114 of the memory device, and the data storage may be irrelevant to the capacitor 132 of the memory device. That is, the memory device may function, e.g., as a 1T-DRAM device, when the memory device operates in the volatile operation mode. Thus, the data stored in the floating body 114 may not be changed by the capacitor 132.

Writing Data "1" in the Volatile Operation Mode

Figure 5:
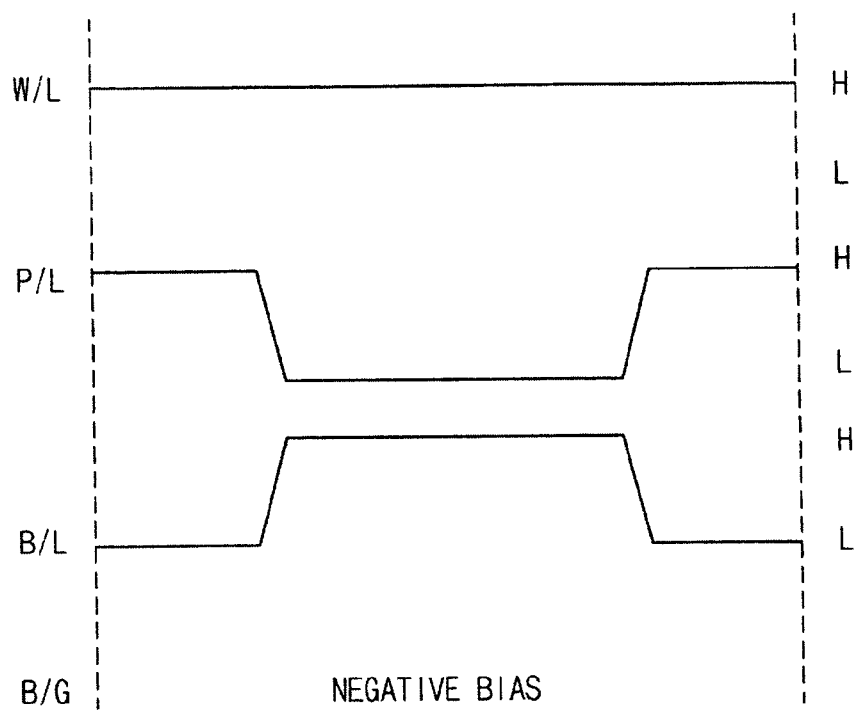
FIG. 5 illustrates a diagram of voltage signals when data "1" is written in a volatile operation mode of a memory device in accordance with an example embodiment.

FIG. 5 illustrates voltage signals of the memory device when data "1" is written in the volatile operation mode. Referring to FIGS. 1 and 5, data "1" may be electrically written in the memory device when electric holes are held in the floating body 114.

Firstly, a back gate voltage may be applied to the semiconductor substrate 100 under the channel region. For example, the back gate voltage may include a negative bias voltage in a range of about (−20) V to about (−40) V. The plate line 134 may be electrically grounded, so that the second impurity region 112 may be grounded by a coupling effect.

Then, a voltage corresponding to a logic state "high" may be applied to the word line 104, thereby turning on the MOS transistor. In addition, the voltage of the bit line 120 may be changed into the logic state "high" in a standby state.

As a result of the voltage applied to the word line 104, a plurality of electron-hole pairs may be generated in the floating body 114 near the first impurity region 110. The electrons in the floating body 114 may move through the first and the second impurity regions 110 and 112, and thus the holes may be accumulated in the floating body 114. The electric potential of the floating body 114 may be increased as the holes accumulate in the floating body 114, and the increase of the electric potential of the floating body 114 may decrease the threshold voltage of the MOS transistor. The above hole accumulation may be called an impact ionization.

Therefore, the hole accumulation by the back gate voltage in the floating body 114 may sufficiently prevent writing into the capacitor 132. Thus, the data "1" may be written in the floating body 114 in the volatile operation mode without any data writing into the capacitor 132.

Although not particularly illustrated in the drawings, the data "1" may be written in the floating body 114 of the memory device in the volatile operation mode through other operation steps. For example, as described previously, the negative bias voltage may be applied to the semiconductor substrate 100 under the channel region as the back gate voltage in the same way as described with reference to FIG. 5, and the plate line 134 may be grounded, so that the second impurity region 112 may be grounded by a coupling effect. A voltage corresponding to the logic state "high" may be applied to the bit line 120.

A negative voltage signal may be applied to the word line 104, unlike the operation steps described with reference to FIG. 5. In this case, a plurality of electron-hole pairs may be generated in the floating body 114 near the first impurity region 110 and the second impurity region 112. The electrons in the floating body 114 may move through the first and the second impurity regions 110 and 112, and thus the holes may be accumulated in the floating body 114. The electric potential of the floating body 114 may be increased as the holes accumulate in the floating body 114, and the increase of the electric potential of the floating body 114 may decrease the threshold voltage of the MOS transistor. The above hole accumulation may be called a gate-induced drain leakage (GIDL).

Writing Data "0" in the Volatile Operation Mode

Figure 6:
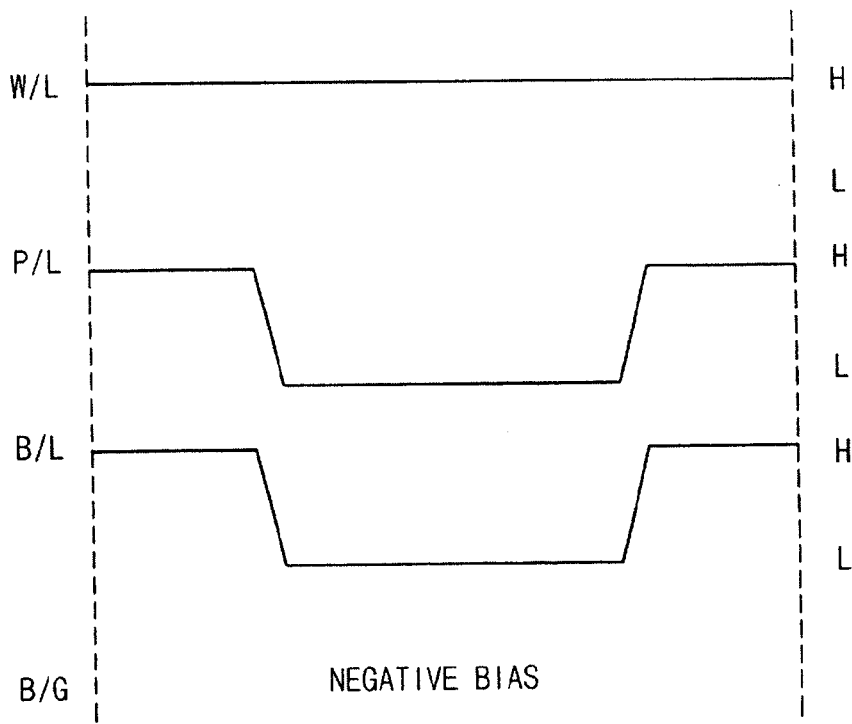
FIG. 6 illustrates a diagram of voltage signals when data "0" is written in a volatile operation mode of a memory device in accordance with an example embodiment.

FIG. 6 illustrates voltage signals of the memory device when data "0" is written in the volatile operation mode. Referring to FIGS. 1 and 6, the data "0" may be electrically written in the memory device when electric holes are moved out from the floating body 114.

Firstly, a back gate voltage may be applied to the semiconductor substrate 100 under the channel region. For example, the back gate voltage may include a negative bias voltage in a range of about (−20) V to about (−40) V. The plate line 134 may be electrically grounded, so that the second impurity region 112 may be grounded by a coupling effect.

Then, a voltage corresponding to a logic state "high" may be applied to the word line 104, thereby turning on the MOS transistor. In addition, the voltage of the bit line 120 may be changed into the logic state "low" in a standby state. For example, the negative voltage or the ground state may be applied to the bit line 120. The electric holes in the floating body 114 may move through the first impurity regions 110.

Method of Storing Data into a Capacitor

When the memory device illustrated in FIG. 1 is operated as a non-volatile memory device (hereinafter referred to as non-volatile operation mode), digital information data may be stored into the capacitor of the memory device in the following operation step. Particularly, when the memory device operates in the non-volatile operation mode, the data storage may be irrelevant to the floating body 114 of the memory device. That is, the memory device may function, e.g., as a FRAM device, when the memory device operates in the non-volatile operation mode.

Writing Data "1" in the Non-Volatile Operation Mode

Figure 7:
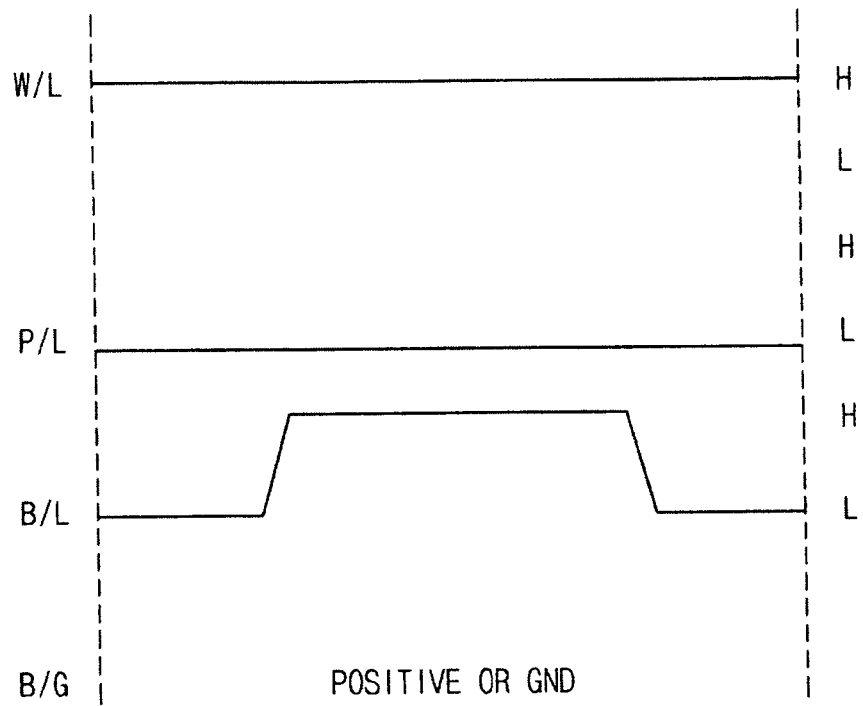
FIG. 7 illustrates a diagram of voltage signals when data "1" is written in a non-volatile operation mode of a memory device in accordance with an example embodiment.

FIG. 7 illustrates voltage signals of the memory device when data "1" is written in the non-volatile operation mode. Referring to FIGS. 1 and 7, the data "1" may be electrically written in the capacitor 132 of the memory device as follows.

A positive voltage may be applied to the semiconductor substrate 100 under the channel region. Alternatively, the semiconductor substrate 100 under the channel region may be grounded. The data "1" may be stored in the capacitor 132 by a polarization due to a voltage difference between the plate line 134 and the bit line 120, and thus writing data "1" may be irrelevant to the voltage state of the semiconductor substrate 100. That is, the data "1" may be written into the capacitor 132 regardless of the positive voltage or the ground state that may be applied to the semiconductor substrate 100 under the channel region.

Particularly, when the memory device operates in the non-volatile operation mode, a negative bias voltage is not applied to the semiconductor substrate 100 under the channel region as the back gate voltage. Thus, electric holes may not accumulate in the floating body 114, so the MOS transistor may function just as a switching device. Accordingly, the operation mode of the memory device may be determined as the volatile operation mode or the non-volatile operation mode in accordance with the back gate voltage application to the semiconductor substrate 100.

In an example embodiment, a voltage corresponding to a logic state "high" may be applied to the word line 104 to turn on the MOS transistor. In addition, the voltage of the bit line 120 may be changed into the logic state "high" in a standby state, while a voltage corresponding to the logic state "low" may be applied to the plate line 134. In the present example embodiment, the plate line 134 may be grounded. As a result, the capacitor 132 may have the polarization state of data "1."

Writing Data "0" in a Non-Volatile Memory Mode

Figure 8:
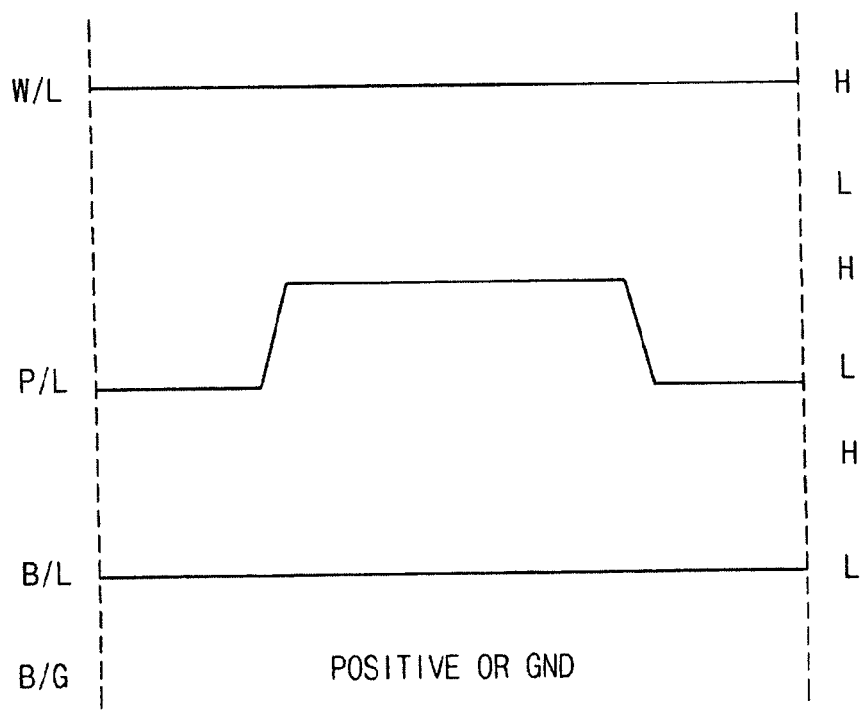
FIG. 8 illustrates a diagram of voltage signals when data "0" is written in a non-volatile operation mode of a memory device in accordance with an example embodiment.

FIG. 8 illustrates voltage signals of the memory device when data "0" is written in the volatile operation mode. Referring to FIGS. 1 and 8, the data "0" may be electrically written in the capacitor 132 of the memory device as follows.

A positive voltage may be applied to the semiconductor substrate 100 under the channel region. Alternatively, the semiconductor substrate 100 under the channel region may be grounded.

A voltage corresponding to a logic state "high" may be applied to the word line 104 to turn on the MOS transistor. In addition, the voltage of the plate line 134 may be changed into the logic state "high" in a standby state, while a voltage corresponding to the logic state "low" may be applied to the bit line 120. In the present example embodiment, the bit line 120 may be grounded.

As a result, the capacitor 132 may have the polarization state of data "0" electrically opposite to the data "1." Therefore, the digital data "0" or "1" may be written in the capacitor 132 according to the polarization state and irrespective of the back gate voltage.

The memory device may be operated as a volatile memory device or a non-volatile memory device in accordance with a selected operation mode. Thus, the digital data stored in the memory device may be read in a different way in accordance with the volatile or non-volatile operation mode. For example, when the memory device operates in the volatile operation mode, the digital data in the memory device may be read in the same way as the data reading operation of the 1T-DRAM device. In contrast, when the memory device operates in the non-volatile operation mode, the digital data in the memory device may be read in the same way as the data reading operation of the FRAM device.

Figure 9:
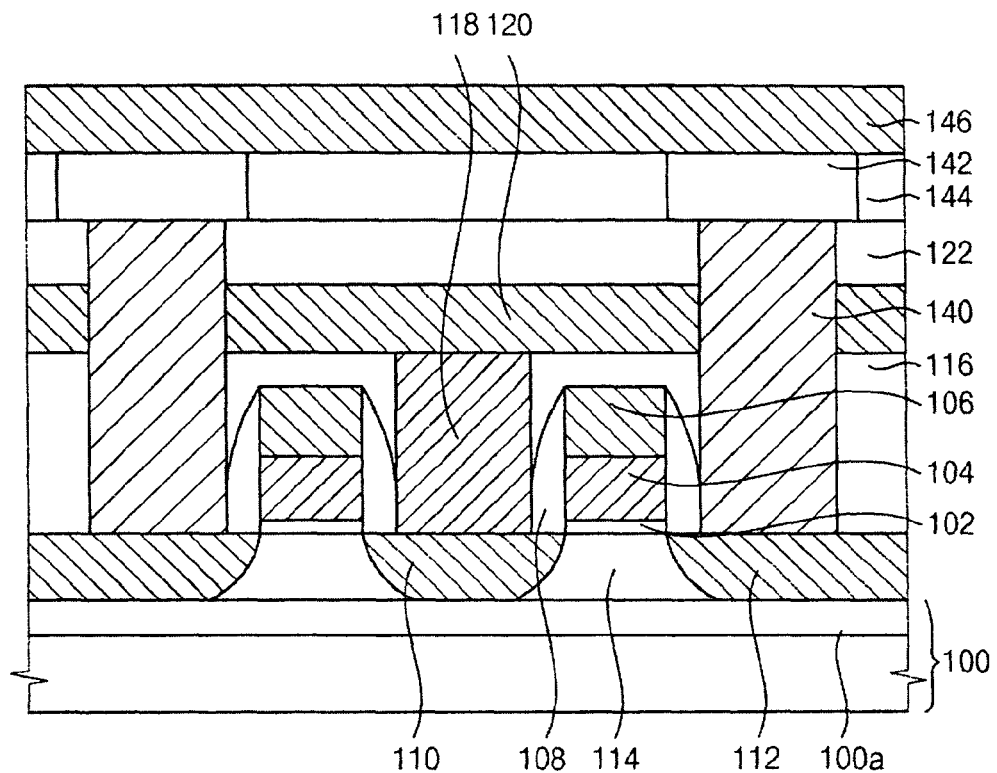
FIG. 9 illustrates a cross-sectional view of a memory device in accordance with another example embodiment.

FIG. 9 illustrates a cross-sectional view of a memory device in accordance with another example embodiment. As illustrated in FIG. 9, the memory device may include a MOS transistor on a semiconductor substrate 100 and a charge storage structure of a non-volatile memory device electrically connected to the MOS transistor.

Referring to FIG. 9, the semiconductor substrate 100 including the buried oxide layer 100*a* may be provided. The gate insulation layer pattern 102 and the gate electrode 104 may be sequentially provided on the semiconductor substrate 100 to form the gate structure. The gate spacer 108 may be provided on sidewalls of the gate structure. The gate electrode 104 may serve as a word line. The gate electrode may extend in a first direction and may have a line shape.

The first and second impurity regions may be provided at surface portions of the semiconductor substrate 100 adjacent to the gate structure in such a configuration that the bottom surface of the first and the second impurity regions 110 and 112 may make contact with the buried oxide layer 100*a*. Thus, the channel region may be defined by the buried oxide layer 100*a* and the first and the second impurity regions 110 and 112. The channel region between the first and the second impurity regions 110 and 112 may be the floating body 114 because the channel region may be in an electrical floating state. Accordingly, the MOS transistor may be provided on the semiconductor substrate 100 including the buried oxide layer 100*a* and may have a substantially same structure as described previously with reference to FIG. 1.

Data may be stored in the MOS transistor by storing holes in the floating body 114 or by moving the holes out from the floating body 114. The threshold voltage of the MOS transistor may be varied according to the movement of the holes in the floating body 114, and thus the data in the MOS transistor may be read by detecting the variation of the threshold voltage. Therefore, the MOS transistor may function as a volatile semiconductor device, e.g., a 1T-DRAM device.

In an example embodiment, the bit line structure may be electrically connected to the first impurity region 110 of the MOS transistor. For example, the bit line structure may include the bit line contact 118 electrically connected to the first impurity region 110 and the bit line 120 electrically connected to the bit line contact 118. The bit line 120 may extend in the second direction substantially perpendicular to the first direction in which the word line may extend.

A charge storage structure may be electrically connected to the second impurity region 112 of the MOS transistor. For example, the charge storage structure may include a lower electrode 140, a phase-changeable pattern 142, and an upper electrode 146 sequentially stacked on the second impurity region 112. The lower electrode 140 may be shaped into a contact plug electrically connected to the second impurity region 112, e.g., may extend between the second impurity region 112 and the phase-changeable pattern 142. The phase-changeable pattern 142 may be positioned on the lower electrode 140 and may include a chalcogenide. The upper electrode 146 may have a line shape, e.g., the upper electrode 146 may be simultaneously connected to a plurality of adjacent phase-changeable patterns 142.

The charge storage structure may be positioned higher than the bit line 120, e.g., a distance between the phase-changeable pattern 142 and the semiconductor substrate 100 may be larger than a distance between the bit line 120 and the semiconductor substrate 100. While the present example embodiment discloses that the charge storage structure is positioned higher than the bit line 120, i.e., as illustrated in FIG. 9, any other modifications to the relative position of the charge storage structure with respect to the bit line 120 is within the scope of the inventive concept. For example, the charge storage structure may be positioned lower than the bit line 120.

The data may be stored in the phase-changeable pattern 142 by changing a phase of the phase-changeable pattern 142. Particularly, when the phase-changeable pattern 142 has a crystalline phase, an electrical resistance of the phase-changeable pattern 142 may be relatively low, and thus an electric current may pass through the phase-changeable pattern 142. Therefore, the digital data "0" may be written in the memory device. In contrast, when the phase-changeable pattern 142 has an amorphous phase, an electrical resistance of the phase-changeable pattern 142 may be relatively high, and thus an electric current may not pass through the phase-changeable pattern 142. Therefore, the digital data "1" may be written in the memory device. Thus, the memory device including the charge storage structure may function as a non-volatile semiconductor device, e.g., a phase-change random access memory (PRAM) device.

Accordingly, the memory device in FIG. 9 may be operated as a volatile memory device or a non-volatile memory device in accordance with a selected operation mode. Therefore, when frequent access and a high operation speed is needed in the memory device, the memory device may operate as a volatile memory device, and when the data in the memory device is needed to be maintained even though the power is turned off, the memory device may operate as a non-volatile memory device.

Figure 10:
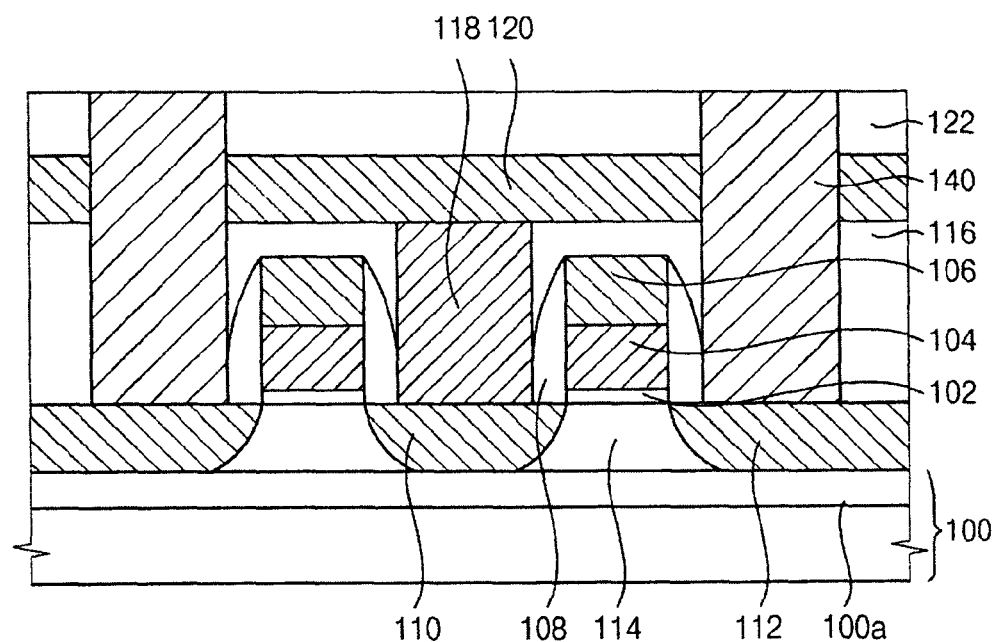
FIGS. 10 to 11 illustrate cross-sectional views of a method of manufacturing the memory device in FIG. 9.
Figure 11:
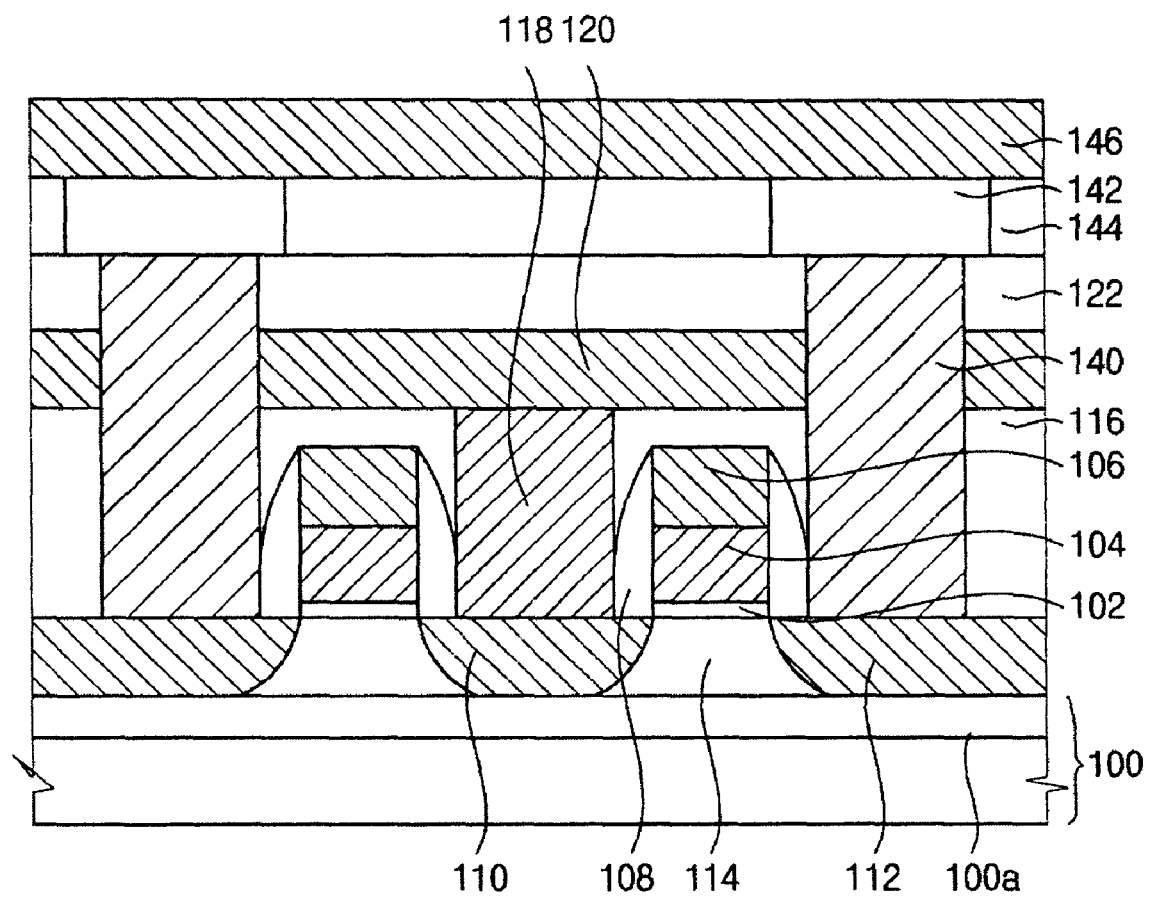

Hereinafter, a method of manufacturing the memory device in FIG. 9 will be described. FIGS. 10 to 11 illustrate cross-sectional views of steps in a method of manufacturing the memory device in FIG. 9.

Referring to FIG. 10, the MOS transistor may be formed on the semiconductor substrate 100 including the buried oxide layer 100a. The MOS transistor may be formed on the semiconductor substrate 100 substantially in the same processing steps as described previously with reference to FIG. 2, and thus further descriptions will not be repeated.

As illustrated in FIG. 10, the first insulating interlayer 116 may be formed to cover the MOS transistor. The bit line contact 118 may be formed through the first insulating interlayer 116 and may contact the first impurity region 110 of the MOS transistor. The bit line 120 may be formed on the first insulating interlayer 116 and may contact the bit line contact 118. The first insulating interlayer 116, the bit line contact 118, and the bit line 120 may be formed substantially in the same processing steps as described with reference to FIG. 3, so further explanations on the same processing steps will not be repeated.

The second insulating interlayer 122 may be formed on the first insulating interlayer 116 and the bit line 120. A portion of the second insulating interlayer 122 and a portion of the first insulating interlayer 116 may be subsequently etched to form a second contact hole exposing the second impurity region 112 of the MOS transistor. A conductive material may be filled in the second contact hole to form a contact plug. The contact plug may serve as the lower electrode 140. It is noted that hereinafter the contact plug 140 and the lower electrode 140 may be used interchangeably.

Referring to FIG. 11, a phase-changeable layer may be formed on the contact plug 140 and the second insulating interlayer 122. The phase-changeable layer (not illustrated) may include a chalcogenide metal. Examples of the chalcogenide metal may include one or more of chalcogenide germanium, chalcogenide antimony, and chalcogenide tellurium.

The phase-changeable layer may be patterned into the phase-changeable pattern 142. The phase-changeable pattern 142 may be formed on the contact plug 140 and the second insulating interlayer 122 in such a manner that the contact plug 140 may be sufficiently covered with the phase-changeable pattern 142. That is, a bottom surface of the phase-changeable pattern 142, i.e., a surface facing the semiconductor substrate 100, may be sufficiently larger than a top surface of the contact plug 140, i.e., a surface facing away from the semiconductor substrate 100.

Thereafter, an insulating layer pattern 144 may be formed on the second insulating interlayer 122 between adjacent phase-changeable patterns 142. The upper electrode 146 may be formed on the phase-changeable patterns 142. The upper electrode 146 may be formed to be simultaneously connected to adjacent phase-changeable patterns 142.

Hereinafter, a method of operating the memory device in FIG. 9 will be described.

Method of Storing Data into a Floating Body

Referring to FIG. 9, when the memory device is operated as a volatile memory device, digital information data may be stored into the floating body 114 of the memory device in the following operation step. When the memory device operates in the volatile operation mode, the data storage may be irrelevant to the charge storage structure of the memory device. That is, the memory device may function, e.g., as a 1T-DRAM device, when the memory device operates in the volatile operation mode.

Firstly, an operation for writing the data "1" in the floating body 114 of the memory device shown in FIG. 9 will be described. The operation of the writing data "1" in the floating body 114 of the memory device may be performed on a basis of the impact ionization and the GIDL.

In the operation of wiring data "1" based on the impact ionization, bias voltages may be applied to the word line 104, the bit line 120, and the semiconductor substrate 100 in the same manner as described with reference to FIG. 5. Particularly, a negative bias voltage may be applied to the semiconductor substrate 100 under the channel region. A voltage corresponding to a logic state "high" may be applied to the word line 104 to turn on the MOS transistor, and the voltage of the bit line 120 may be changed into the logic state "high" in a standby state. In addition, the upper electrode 146 may be electrically grounded. Therefore, the second impurity region 112 of the MOS transistor may be grounded because the phase-changeable pattern 142 and the lower electrode 140 may function as a resistance.

In the operation of wiring data "1" based on the GIDL, a negative bias voltage may be applied to the semiconductor substrate 100 under the channel region. A negative voltage signal may be applied to the word line 104, and the voltage of the bit line 120 may be changed into the logic state "high." The upper electrode 146 may be grounded, so that the second impurity region 112 may be grounded.

When electrical signals are applied to the memory device as described above, electric potential of the floating body 114 may be increased as the holes accumulate in the floating body 114. The increase of the electric potential of the floating body 114 may decrease the threshold voltage of the MOS transistor.

A Method of Storing Data into a Charge Storage Structure

When the memory device shown in FIG. 9 is operated as a non-volatile memory device, digital information data may be stored into the charge storage structure of the memory device in the following operation step. When the memory device operates in the non-volatile operation mode, the data storage may be irrelevant to the floating body 114 of the memory device. That is, the MOS transistor in the memory device may function as a switching device. Thus, positive voltage or ground state may be applied to the semiconductor substrate 100 under the channel region, so holes may not accumulate in the floating body 114 of the MOS transistor.

The writing of data "1" in the charge storage structure including the phase-changeable pattern 142 may require a relatively high electrical current pulse applied to the phase-changeable pattern 142 within a short time. The phase of the phase-changeable pattern 142 may be changed into an amorphous state by rapidly cooling down the phase-changeable pattern 142. For example, the phase-changeable pattern 142 may be heated by an electrical current pulse to a temperature higher than a melting point Tm for a short time, and then, the phase-changeable pattern 142 may be rapidly cooled down to change the phase of the phase-changeable pattern 142 into the amorphous structure.

The application of the high current pulse to the phase-changeable pattern 142 may require that high voltage be applied to the bit line 120 of the memory device after a signal is applied to the word line 104. Therefore, the bit line voltage may be pumped up during the operation of writing data "1" in the charge storage structure. For example, pumping up of the bit line voltage may be performed by an additional driving circuit.

In contrast, writing of data "0" in the charge storage structure including the phase-changeable pattern 142 may require a relatively low current pulse applied to the phase-changeable pattern 142 for a longer time than is needed in the operation of writing data "1." For example, the phase-changeable pattern 142 may be heated by an electrical current pulse to a temperature between a melting point Tm and a crystallization point Tc, and then, the heated phase-changeable pattern 142 may be gradually cooled down for a relatively long time to change the phase of the phase-changeable pattern 142 into a crystalline structure.

Applying the low current pulse to the phase-changeable pattern 142 may require a bit line voltage lower than is needed in the operation of writing data "1." That is, a relatively low voltage may be applied to the bit line 120 of the memory device after a signal is applied to the word line 104, so the bit line voltage may not be pumped up during the operation of writing data "0" in the charge storage structure. Therefore, the memory device illustrated in FIG. 9 may be operated in the volatile mode or the non-volatile mode in accordance with the driving circuit for pumping up the bit line voltage.

As described above, the memory device according to example embodiments may operate as a volatile memory device or a non-volatile memory device in accordance with a selected operation mode. Thus, digital data stored in the memory device may be read in a different way in accordance with the volatile or non-volatile operation mode.

For example, when the memory device operates in the volatile memory mode, the digital data in the memory device may be read in the same way as the data reading operation of the 1T-DRAM device. In contrast, when the memory device operates in the non-volatile operation mode, the digital data in the memory device may be read in the same way as the data reading operation of the PRAM device. Thus, electronic devices or telecommunication devices may include memory devices according to example embodiments, thereby having selective operational modes via non-volatile or volatile memory devices.

According to example embodiments, a memory device may operate as a volatile memory device or a non-volatile memory device in accordance with a selected operating mode. Negligible additional costs may be required for manufacturing the memory device. The memory device may have different characteristics in accordance with the selected operation mode. Therefore, the memory device has been widely employed in electronic products and telecommunications products requiring the volatile memory device and/or the non-volatile memory device. In addition, the memory device has been widely employed in the electronic products and the telecommunications products requiring the memory device having a high integration degree.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A memory device, comprising:
 a semiconductor substrate including a buried oxide layer, the semiconductor substrate being connected to a voltage source, and the voltage source being configured to output at least two different voltages;
 a metal-oxide semiconductor (MOS) transistor on the semiconductor substrate, the MOS transistor including a gate structure, a first impurity region, a second impurity region, and a floating body between the first impurity region and the second impurity region; and
 a charge storage structure of a non-volatile memory device electrically connected to the second impurity region of the MOS transistor, the charge storage structure and the floating body of the MOS transistor being configured to operate independently of each other in accordance with the different voltages output by the voltage source.

2. The memory device as claimed in claim 1, wherein the charge storage structure includes a capacitor having a lower electrode, a ferroelectric layer pattern, and an upper electrode.

3. The memory device as claimed in claim 2, further comprising a contact plug interposed between the lower electrode of the capacitor and the second impurity region.

4. The memory device as claimed in claim 2, further comprising a plate line electrically connected to the upper electrode of the capacitor.

5. The memory device as claimed in claim 1, wherein the charge storage structure includes a capacitor having a lower electrode, a phase-changeable pattern, and an upper electrode.

6. The memory device as claimed in claim 5, wherein the lower electrode has a contact plug shape.

7. The memory device as claimed in claim 1, further comprising a bit line electrically connected to the first impurity region.

8. The memory device as claimed in claim 1, wherein bottom surfaces of the first impurity region and the second impurity region contact the buried oxide layer, the floating body being defined by the first impurity region, the second impurity region, and the buried oxide layer.

9. The memory device as claimed in claim 1, wherein the memory device is configured to function both as a volatile memory device and as a non-volatile memory device in accordance with a voltage applied to the semiconductor substrate.

10. The memory device as claimed in claim 1, wherein only one of the floating body of the MOS transistor and the charge storage structure is configured to operate at a time in accordance with the voltages output by the voltage source.

11. The memory device as claimed in claim 1, wherein the MOS transistor and the charge storage structure have separate charge storage elements.

12. A memory device, comprising:
- a semiconductor substrate including a buried oxide layer, the semiconductor substrate being connected to a voltage source, and the voltage source being configured to output at least two different voltages;
- a metal-oxide semiconductor (MOS) transistor on the semiconductor substrate, the MOS transistor including a gate structure and a first storage layer between the gate structure and the semiconductor substrate; and
- a charge storage structure of a non-volatile memory device electrically connected to the MOS transistor, the charge storage structure including a second storage layer, only one of the first and second storage layers being configured to operate at a time in accordance with the different voltages output by the voltage source.

13. The memory device as claimed in claim 12, wherein the first and second storage layers are within a same memory cell, the first and second storage layers being different memory types.

* * * * *